(12) United States Patent
Wig et al.

(10) Patent No.: US 7,501,586 B2
(45) Date of Patent: Mar. 10, 2009

(54) APPARATUS AND METHOD FOR IMPROVING PRINTED CIRCUIT BOARD SIGNAL LAYER TRANSITIONS

(75) Inventors: Timothy Wig, Northborough, MA (US); Tao Liang, Westford, MA (US)

(73) Assignee: Intel Corporation, Santa Clara, CA (US)

( * ) Notice: Subject to any disclaimer, the term of this patent is extended or adjusted under 35 U.S.C. 154(b) by 184 days.

(21) Appl. No.: 10/976,423

(22) Filed: Oct. 29, 2004

(65) Prior Publication Data

US 2006/0090933 A1  May 4, 2006

(51) Int. Cl.
  *H01R 12/04* (2006.01)
  *H05K 1/11* (2006.01)
(52) U.S. Cl. ................. 174/262; 361/792
(58) Field of Classification Search ......... 174/262–266; 361/792–795
  See application file for complete search history.

(56) References Cited

U.S. PATENT DOCUMENTS

| | | | |
|---|---|---|---|
| 4,789,770 A | 12/1988 | Kasner et al. | |
| 4,839,497 A | 6/1989 | Sankar et al. | |
| 5,432,484 A | 7/1995 | Klas et al. | |
| 5,499,445 A | 3/1996 | Boyle et al. | |
| 6,229,095 B1 * | 5/2001 | Kobayashi | 174/255 |
| 6,521,843 B1 | 2/2003 | Kohya | |
| 6,710,675 B2 | 3/2004 | Mikalauskas | |
| 7,013,452 B2 | 3/2006 | Baras | |
| 2002/0083255 A1 * | 6/2002 | Greeff et al. | 710/305 |
| 2004/0136169 A1 | 7/2004 | Morimoto et al. | |
| 2004/0188138 A1 | 9/2004 | Baras et al. | |
| 2005/0161255 A1 * | 7/2005 | Takada | 174/262 |

FOREIGN PATENT DOCUMENTS

EP  1463387  9/2004

* cited by examiner

*Primary Examiner*—Jeremy C Norris
(74) *Attorney, Agent, or Firm*—Philip A. Pedigo

(57) ABSTRACT

A method and apparatus for improving printed circuit board signal layer transitions are described. In one embodiment, the method includes the formation of a first via within a printed circuit board (PCB). A second via is formed concurrently within the PCB. In one embodiment, the second via is positioned proximate the first via to enable electromagnetic coupling between the first and second vias. Following formation of the second via, the first and second vias are connected to provide a series connection between the first and second vias. In one embodiment, the series connection between the first and second vias reduces a stub length with respect to the first via to reduce and potentially eliminate stub resonance for, for example, short signal layer transitions. Other embodiments are described and claimed.

17 Claims, 12 Drawing Sheets

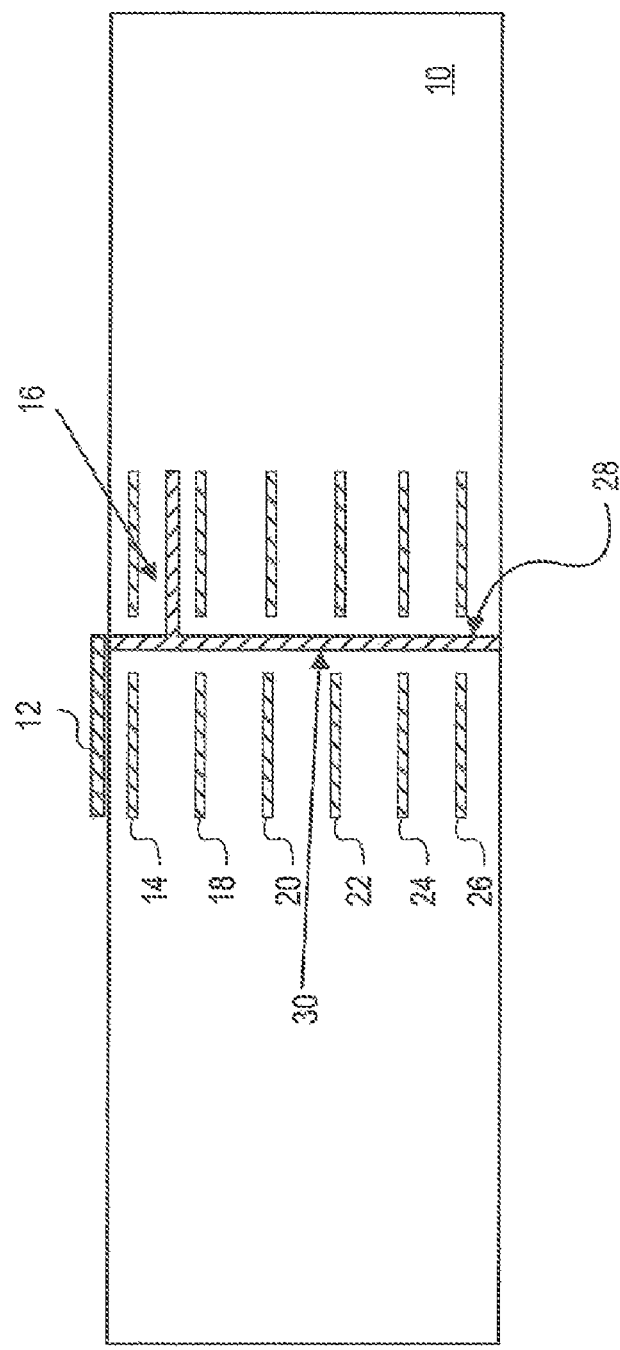

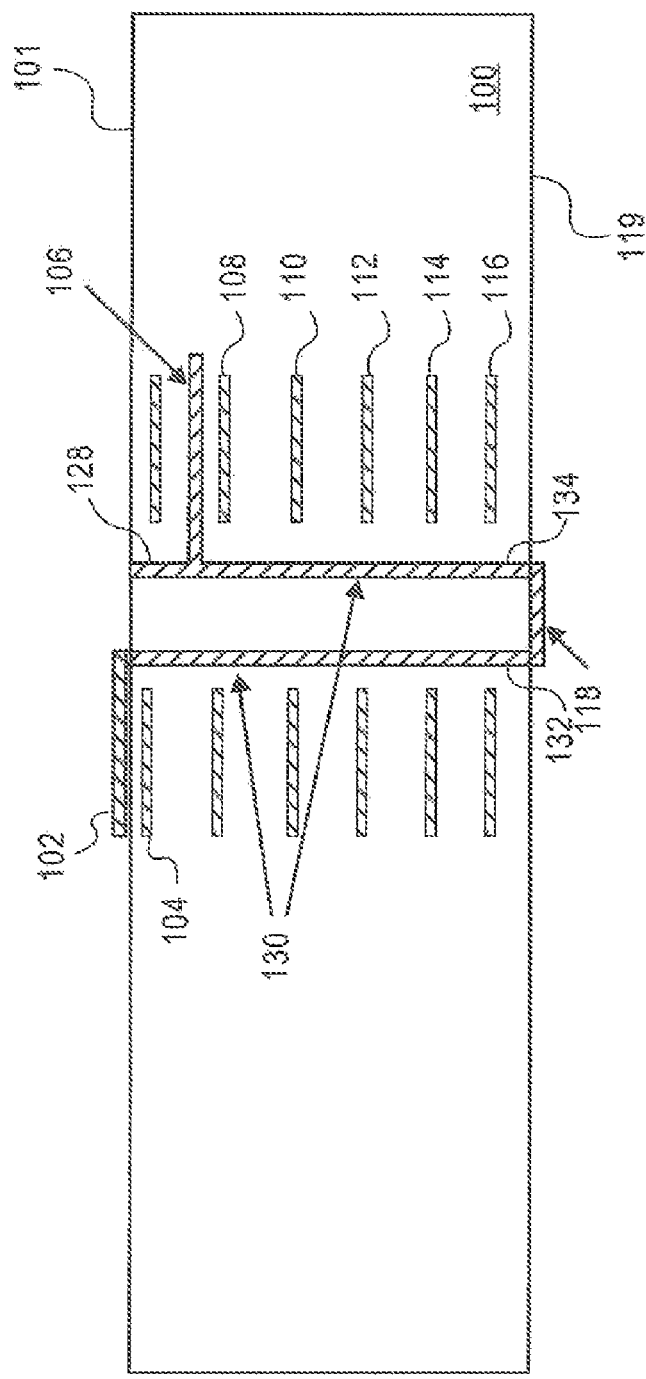

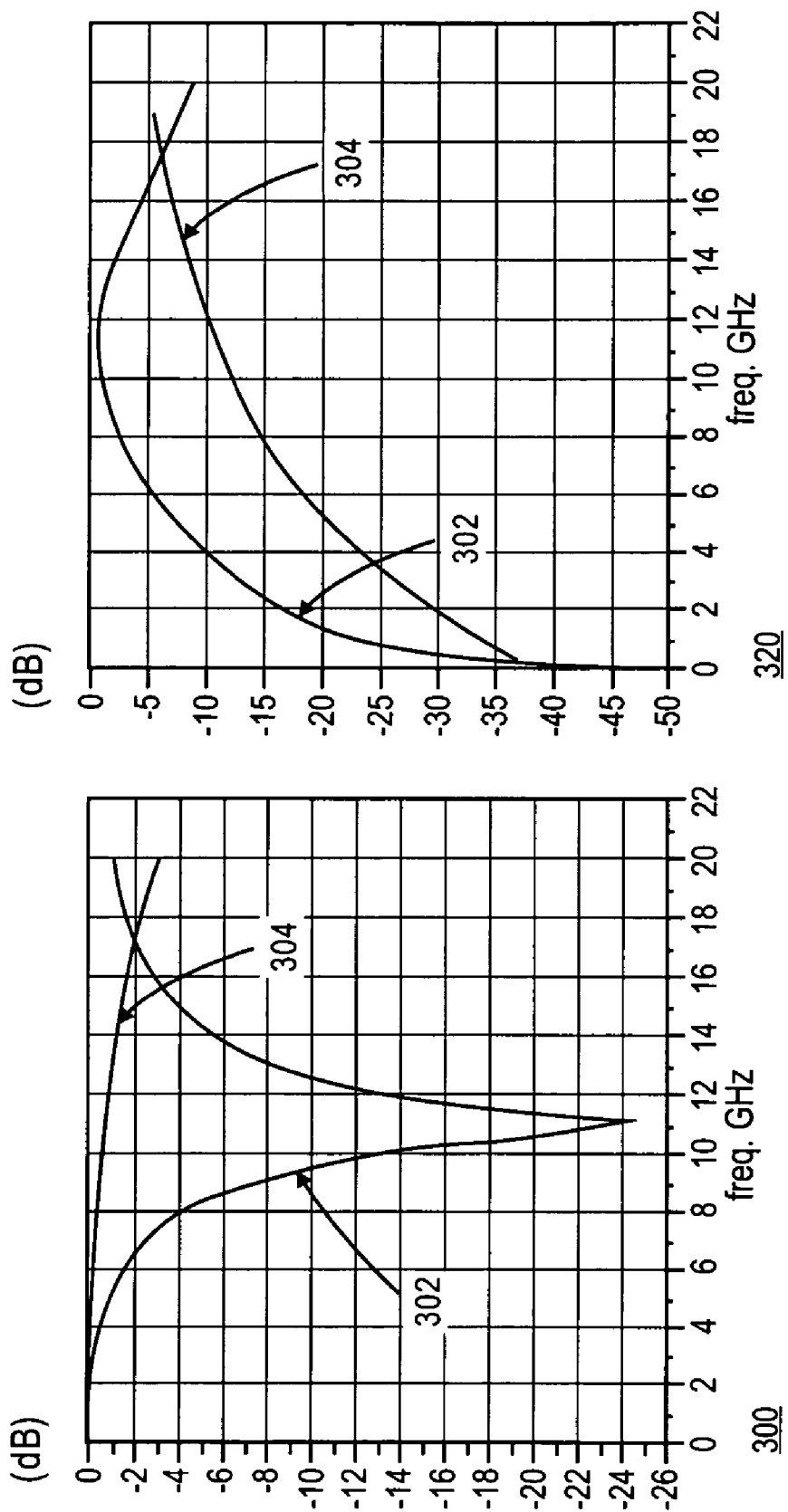

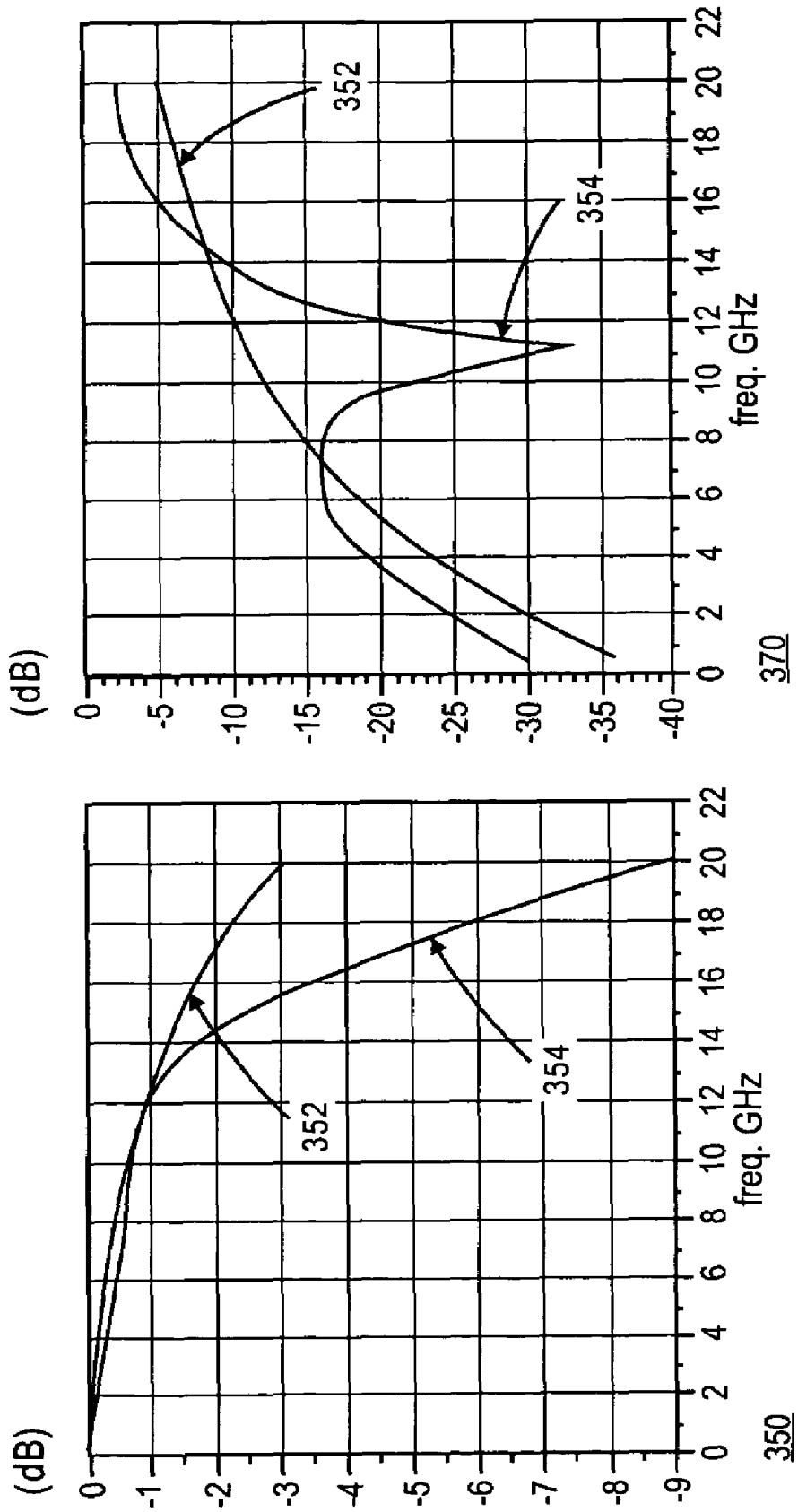

APPARATUS AND METHOD FOR IMPROVING PRINTED CIRCUIT BOARD SIGNAL LAYER TRANSITIONS

FIELD

One or more embodiments relate generally to the field of integrated circuit and computer system design. More particularly, one or more of the embodiments relate to a method and apparatus for improving printed circuit board signal layer transitions

BACKGROUND

A via is typically used to route a signal between two layers on a printed circuit board (PCB) referred to herein as "signal layer transition." PCBs that contain vias commonly have four or more metal layers and may be composed of flame retardant 4 (FR4) material. In a typical four-layer board, for example, two layers are used for routing, and two for power and ground. Complex boards may exceed forty layers, with several power planes and numerous ground and routing layers. The thickness of PCBs may vary, but typically falls between 0.060 inches and 0.250 inches. The thickness of a board is generally dictated by the number of layers required to provide adequate power delivery, plane capacitance, ground references, shielding, desired trace impedance and convenient routing.

As illustrated in FIG. 1, circuit board 10 includes twelve layers (12-26). Representatively, via 30 provides a signal layer transition between, for example, micro-strip layer 12 and a strip line metal layer 16 of circuit board 10 The plated-through hole (PTH), a common means of implementing a via, is formed during PCB fabrication by first mechanically drilling a hole completely through the board following lamination, then plating the walls of the hole with copper or another conductor. This forms a tubular or solid conductive barrel that serves as a continuous electrical path through the board's entire thickness, connecting any metal layers or traces that abut the barrel.

A shortcoming of a PTH via is that its electrical behavior depends on which signal layers transit through its barrel. A through-board via, a PTH that passes a signal completely through the board to an opposite side of the board, can typically be designed to be absent any pronounced resonance, though it will contribute a small amount of loss and reflection of a very broad range of frequencies. As illustrated in FIG. 1, PTH via 30 provides a signal layer transition that is less than a thickness of the board referred to herein as a "short layer transition." For example, a PTH used for a short layer transition, or perhaps only 0.010 inches of a 0.092 inch thick board, as shown in FIG. 1, results in a significant portion of its length (28) that does not carry the direct signal between layers referred to herein as "via stub." As illustrated in FIG. 1, the unused length of PTH via 30 constitutes via stub 28 that exhibits a strong frequency-dependent behavior as signals approach its stub resonance frequencies.

The high frequency resonance exhibited by via stubs in PCBs is a common problem. Stub resonance is a well-known phenomenon in which any signals that traverse layers in a circuit board through a via possessing a stub are affected by the inherent passive resonance exhibited by the via stub. The resonance falls at frequencies dictated by the local geometry and composition of the PCB. This effect can dramatically reduce the fraction of energy that reaches the intended receiver, while increasing reflections toward the transmitter. Via stubs can also increase the parallel-plate mode conversion effect that plays a role in board resonance and via-to-via crosstalk.

Furthermore, via stub effects are becoming increasingly problematic as data rates used in circuit boards increase to the multiple gigabit/second (gb/s) range, and significant signal frequency spectral content approaches the resonance frequencies of their stubs. High reflection and low transmission through vias possessing stubs is a principal barrier to further increases in data transmission speed on circuit boards. Currently, there are no economical, straightforward methods to mitigate the via stub in many common via configurations, which may include ordinary open field layer transitions, or vias used to attach integrated circuit packages, chipset sockets or connectors.

Current techniques of dealing with stubs cannot be applied using processing technology currently available in many high volume manufacturing (HVM) circuit board production facilities. Several methods have been developed to mitigate the via resonance effect and to otherwise minimize the effects of a via's electrical parasitics. These methods may include adjusting the size and shape of the pad and anti-pad of the via or the size of the drilled hole. They may also include back-drilling and blind and buried vias. However, many of these methods require additional processing operations that are not available in HVM processes.

BRIEF DESCRIPTION OF THE DRAWINGS

The various embodiments of the present invention are illustrated by way of example, and not by way of limitation, in the figures of the accompanying drawings and in which:

FIG. 1 is a block diagram illustrating a circuit board having a conventional plated-through hole via.

FIG. 2 is a block diagram illustrating a pair of series coupled vias, connected in series, in accordance with one embodiment.

FIGS. 5A and 5B depict graphs illustrating a comparison between differential transmission and reflection for a through-board via versus a stub connection.

FIGS. 6A and 6B depict graphs illustrating differential transmission and reflection for a through-board via versus a series coupled via, in accordance with one embodiment.

DETAILED DESCRIPTION

Figure 3A:
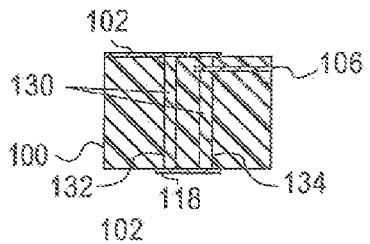
FIGS. 3A-3H are block diagrams illustrating various implementations of series coupled vias of FIG. 2, in accordance with one or more embodiments.

In the following description, numerous specific details such as logic implementations, sizes and names of signals and buses, types and interrelationships of system components, and logic partitioning/integration choices are set forth to provide a more thorough understanding. It will be appreciated, however, by one skilled in the art that described embodiments may be practiced without such specific details. In other instances, control structures and gate level circuits have not been shown in detail to avoid obscuring the described embodiments. Those of ordinary skill in the art, with the included descriptions, will be able to implement appropriate circuits without undue experimentation.

In the following description, certain terminology is used to describe features of the invention. For example, the term "logic" is representative of hardware and/or software configured to perform one or more functions. For instance, examples of "hardware" include, but are not limited or restricted to, an integrated circuit, a finite state machine or even combinatorial logic. The integrated circuit may take the form of a processor such as a microprocessor, application specific integrated circuit, a digital signal processor, a microcontroller, or the like.

FIG. 2 is a block diagram illustrating circuit board 100 including one pair (132 and 134) of vias connected in series to provide a signal layer transition between one or more circuit board layers, in accordance with one embodiment. As described herein, pairs of vias connected in series to provide a signal layer transition between one or more circuit board layers are sometimes referred to herein as "boomerang vias." In one embodiment, a boomerang via includes a structure formed from a combination of vias connected in series to improve signal transmission in a circuit board while reducing reflection, crosstalk and coupling to parallel plate resonance modes.

In one embodiment, FIG. 2 illustrates boomerang via 130 to provide a new means of board routing by which the performance of two or more series via transitions through a board enable a signal layer transition that is markedly superior to that of a single via transition, for example, as shown in FIG. 1. Representatively, boomerang via 130 provides a signal layer transition between a metal micro-strip layer 102 and a metal strip line layer 106 of circuit board, or PCB, 100. In contrast to the conventional PTH via 30, as shown in FIG. 1, boomerang via 130 includes first via 132 and second via 134 coupled in series on backside 119 of PCB 100 distal from topside 101 of PCB 100 that includes metal micro-strip layer 102. In one embodiment, first via 132 and second via 134 are concurrently formed within PCB 100. Representatively, first via 132 and second via 134 are joined at metal micro-strip layer 118 to provide a series connection between first via 132 and second via 134 to form boomerang via 130. Representatively, via stub 138 of boomerang via 130 is significantly reduced to provide an improved signal layer transition between layers 102 and 106 of circuit board 100, in contrast to via stub 28, as shown in FIG. 1.

FIG. 3A is a block diagram illustrating circuit board 100, including boomerang via 130, in accordance with the embodiment illustrated with reference to FIG. 2. Representatively, boomerang via 130 provides a signal layer transition between first layer 102 one and third layer 106 of circuit board 100. As further illustrated, a series connection between first via 132 and second via 134 is provided on backside 119 of circuit board 100 distal from metal micro-strip layer 102. In one embodiment, the spacing between first via 132 and second via 134 of boomerang via 130, as well as the drill size and other parameters, may be varied to control coupling of vias 132 and 134 to "tune" the performance of boomerang via 130 to further improve transmission. In one embodiment, parallel plate mode coupling and other cross-talk mechanisms may be further reduced by adjusting various parameters for formation of a boomerang via, in accordance with the described embodiments.

Figure 3B:
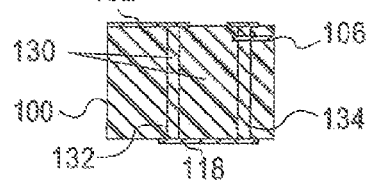

FIG. 3B is a block diagram illustrating circuit board 100, including boomerang via 130 having first via 132 and second via 134 coupled in series at a backside of circuit board 100. However, in contrast to FIG. 3A, a spacing between first via 132 and second via 134 is increased to provide a loose coupling between first via 132 and second via 134, in contrast to the tight coupling provided by the close spacing of first via 132 and second via 134, as illustrated with reference to FIG. 3A.

Figure 3C:
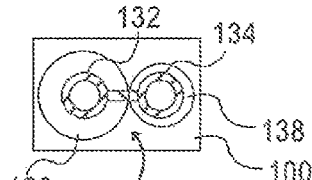

FIG. 3C further illustrates boomerang via 130, wherein an anti-pad is increased, in accordance with one embodiment. Representatively, first via 132 includes anti-pad 136 and second via 134 includes anti-pad 138. In the embodiment illustrated, anti-pad 136 is larger than anti-pad 138. In one embodiment, boomerang via 130 is formed with the difference in size between anti-pad 136 and anti-pad 138 to optimize self-inductance and capacitance of the boomerang via structure. In alternative embodiments, the size anti-pad 136 may be less than or equal to the size of anti-paid 138 to achieve a desired inductive and capacitive coupling between first via 132 and second via 134. In one embodiment, a shape of anti-pads can be other than circular (as shown), such as square or a combination thereof to provide sufficient spacing for a micro-strip to connect with a ground layer to prohibit a short circuit.

Figure 3D:
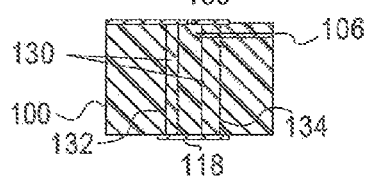

FIG. 3D is a block diagram illustrating boomerang via 130, wherein second via 134 has a diameter which is greater than first via 132, in accordance with one embodiment. In one embodiment, adjustment of the diameter of a first via 132 or second via 134 of a boomerang via 130 is performed to optimize the self-inductance and capacitance for a particular stack of a layered transition in a conventional singled-ended or differential via structure. In some embodiments, the first via 132 may have a greater diameter than the second via 134.

Figure 3E:
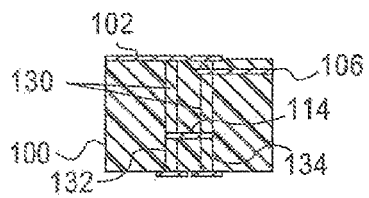
Figure 3F:
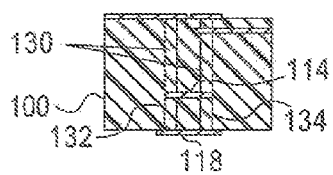

FIG. 3E further illustrates boomerang via 130 to provide a series connection between first via 132 and second via 134 within an internal layer 114 of circuit board 100. In one embodiment, such a configuration is provided to yield a decreased mutual inductance between first via 132 and second via 134. As illustrated in FIG. 3F, in one embodiment, boomerang via 130 may be formed by providing a series connection between first via 132 and second via 134 at multiple circuit board layers (114 and 118). Representatively, first via 132 is coupled to second via 134 at internal layer 114, as shown in FIG. 3E, and on a backside of circuit board 100, as shown in FIGS. 3A-3D.

Figure 3G:
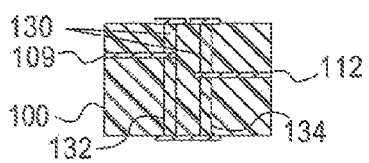
Figure 3H:
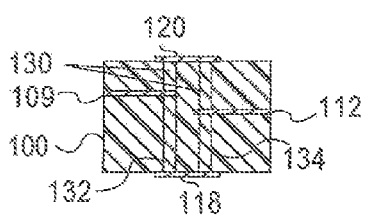

FIGS. 3G and 3H illustrate boomerang via 130 to provide a signal layer transition between fifth layer 109 and a seventh layer 112 of circuit board 100. As shown in FIG. 3G, the series connection between first via 132 and second via 134 is provided on a backside of circuit board 100. Representatively, remaining stubs resulting from the series connection shown in FIG. 3G may be significant for boards having larger thicknesses. Accordingly, in one embodiment, as shown in FIG. 3H, boomerang via 130 is provided with the parallel connection at first layer 102 and bottom layer 118 of circuit board 100 to eliminate the stubs, as shown in FIG. 3G.

Figure 4A:
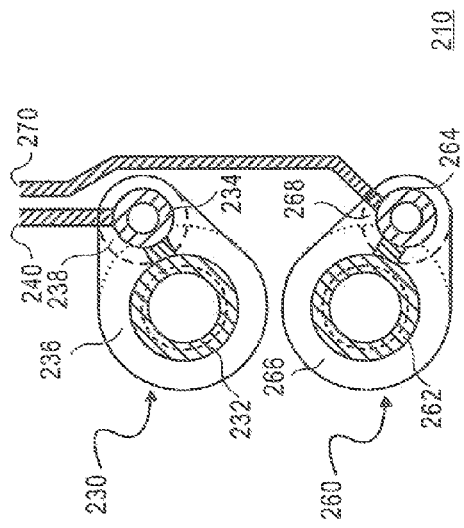
FIGS. 4A-4D depict differential series coupled vias in a production connector pin field, in accordance with one or more embodiments.

FIG. 4A is a block diagram illustrating differential boomerang vias (230 and 260) in a production connector pin field 200, in accordance with one embodiment. In some embodiments, one or more vias may be coupled in series. Representatively, boomerang via 230 and boomerang via 260 are formed to provide loose coupling between the respective vias used to form the boomerang via, as well as loose coupling between differential signal vias 234 and 264. Accordingly, as illustrated, first boomerang 230 via includes first via 232 and second via 234. Likewise, second boomerang via 260 includes third via 262 and fourth via 264. As shown, the first and second vias (232 and 234) of first boomerang via 230 and third and fourth vias (262 and 264) of second boomerang via 260 are spaced apart to provide a loose coupling between the respective vias. Likewise, as shown, second via 234 is spaced away from fourth via 264 to limit coupling between second via 234 and fourth via 264. In one embodiment, conductive matter may be added to at least one of the first via and the second via to form, for example, an annular ring to increase electromagnetic coupling.

Figure 4B:
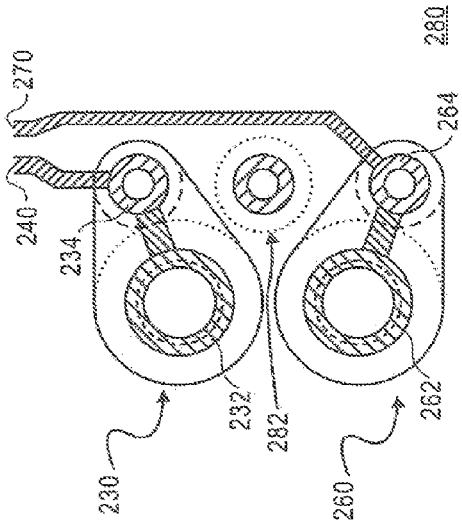

As shown in FIG. 4B, spacing between first via 232 and second via 234, as well as third via 262 and fourth via 264, is the same as shown in FIG. 3A. However, second via 234 and fourth via 264 are positioned proximate to one another to provide tight coupling between second via 234 and fourth via 264 according to one embodiment. In one embodiment, a first differential signal pin is coupled to first via 232 and a second differential signal pin is coupled to third via 262. Representatively, first signal trace 240 coupled to second via 234 and second signal trace 270 coupled to fourth via provide a differential signal pair.

Figure 4C:
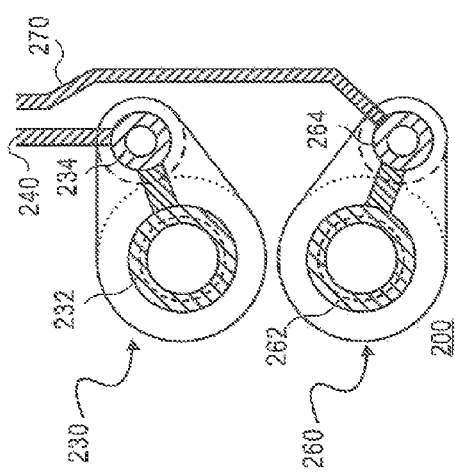

FIG. 4C further illustrates one embodiment of first boomerang via 230 and second boomerang via 260, as shown in FIGS. 4A and 4B, wherein a spacing between first via 232 and second via 234, as well as third via 262 and fourth via 264 is reduced to provide tight coupling between the respective vias of first boomerang via 230 and second boomerang via 260. Similar to the embodiments shown in FIG. 4A, second via 234 and fourth via 264 are spaced apart to provide loose coupling between second via 234 and fourth via 264.

Figure 4D:
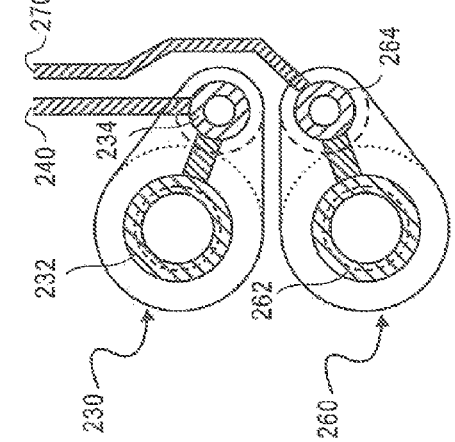

FIG. 4D further illustrates one embodiment wherein first boomerang via 230 and second via 260, as shown in FIG. 4A, to provide loose coupling between the respective vias of first boomerang via and second boomerang via. However, in contrast to the embodiment illustrated with reference to FIG. 4A, as shown in FIG. 4D, ground via 282 is provided between second via 234 and fourth via 264 to provide shielding and improved common mode performance for differential traces 202 and 204, according to one embodiment. In one embodiment, additional ground via 282 provides additional ground return paths, to better control loop inductance, as well as additional shielding from nearby signal vias, since the added vias in a pinfield may place a signal more closely toward potential sources or recipients of crosstalk.

FIGS. 5A and 5B illustrate the impact of via stubs by comparing transmission (insertion loss) 300, as shown FIG. 5A and reflection (return loss) 320, as shown in FIG. 5B, between realistic through board connected vias 304 and stub connected vias 302 possessing otherwise identical geometries on a relatively thin 0.062 inch thick twelve layer board, for example, as shown in FIG. 2. As described above, a through board via describes a PTH that passes a signal completely through the board to an opposed side that can typically be designed to be absent of any pronounced resonance, though it will contribute a small amount of loss and reflection over a broad range of frequencies.

For a relatively thin, low layer count board, the first resonance frequency of an unused via stub may fall in the 15 gigahertz (GHz) range. Bigger circuit boards, such as those commonly used in high-speed backplanes and computer servers, will have stub resonance frequencies that are much lower, falling below 10 GHz. The stub resonance affect typically manifests an increase in signal reflection and a decrease in signal transmission. If the signaling used in the board possesses significant frequency content near the resonance frequencies, the signal will suffer degradation and distortion.

Referring again to FIGS. 5A and 5B, since differential signaling is increasingly common at high data rates, all plots shown in FIGS. 5A and 5B were generated for a differential routing scheme, though similar phenomena occur in both single-ended and differential signal routing. Representatively, as the via stub resonance frequency falls below 10 GHz, its affects are pronounced even in the GHz region. The 15 decibel (dB) return loss threshold, often uses a measure of the acceptability for a connector, lies at 2.2 GHz. A thicker, 0.250 inch thick board exhibits even worse performance, and would have correspondingly lower resonance frequencies that would preclude data transmission, even at current data rates.

FIGS. 6A and 6B illustrate plots for an identical stack up and via configuration used to produce FIGS. 5A and 5B, wherein pairs of these same coupled vias are connected in series to form a boomerang via 354 for each signal, in accordance with one embodiment. Representatively, the performance compares favorably to that of a single through board transition 352 to beyond 12 GHz, as shown in FIGS. 6A and 6B. Representatively, the 1 dB transmission frequency has been extended from 5 GHz to 13 GHz. Similarly, the 15 dB reflection frequency has been extended from 2.2 GHz to 12 GHz. This improvement was obtained with no attempt at optimization.

However, as illustrated with reference to FIGS. 3A to 3H and FIGS. 4A to 4D, similar parameters are available to further improve performance of a via structure, such as a boomerang via, in accordance with the described embodiments. In one embodiment, the use of electromagnetic simulators enable optimization by varying several parameters include adjusting of the hole diameter, pad size, anti-pad size and shape to optimize, for example, the self-inductance and capacitance for a particular stack up and layer transition using a boomerang via. Conventional vias used for differential routing typically allow optimization of mutual inductance and capacitance between separate conductors by adjustment of their spacing. All of these factors may be adjusted similarly with single-ended and differential routed boomerang vias, in accordance with one embodiment.

With the introduction of boomerang vias, the spacing between any of the four drills used for differential routing (See FIGS. 4A-4D) would provide several additional parameters that may be used for further optimization. In one embodiment, boomerang connected vias need not be the same diameter, which may be useful in conserving routing space or achieving more optimal coupling. Further, in one embodiment, more than two vias may be used in series to provide additional benefits, while remaining within the scope of the embodiments and described claims. In one embodiment, the boomerang via may be used to provide a through hole or press fit structures that are fed with a component side micro-strip line, which normally suffer substantial sub-resonance difficulties. For example, as illustrated with reference to FIGS. 4A-4B, a connector pin could be inserted within first via 232, while a trace is coupled to second via 234, as shown in FIG. 4A.

Figure 7:
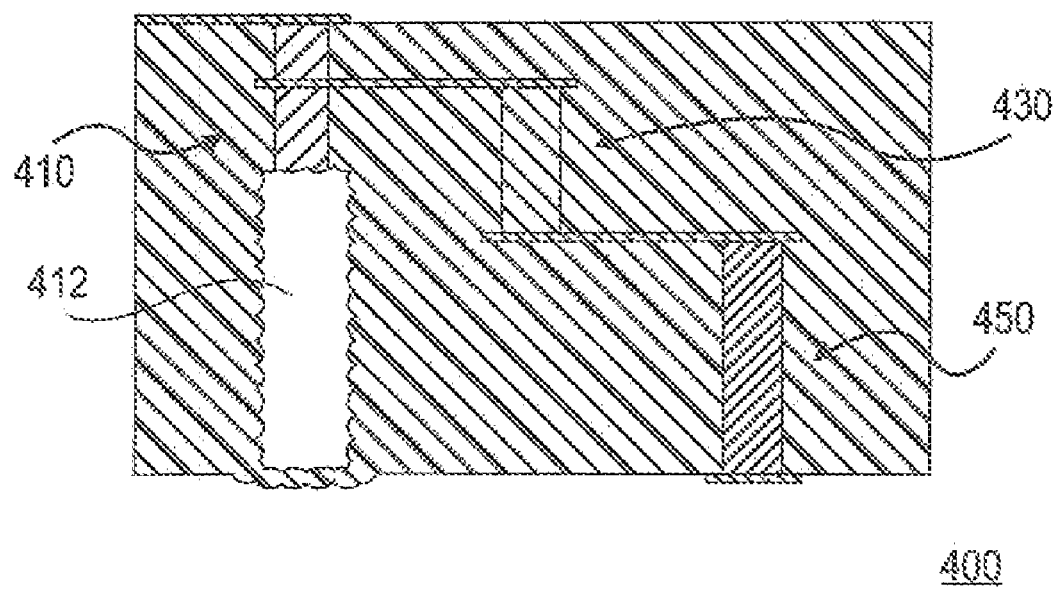
FIG. 7 is a diagram illustrating a circuit board including a conventional back-drilled via, a conventional buried via and a conventional blind via.

FIG. 7 is a diagram illustrating circuit board 400 to illustrate methods to mitigate the via resonance effect, as shown in FIG. 1A. Representatively, FIG. 4 illustrates back-drilled via 410, buried via 430 and blind via 150, as known in the art. The via configurations illustrated in FIG. 7 reduce the length of the via stub. Representatively, back-drilled via is generally formed following the plating of a board's fabrication. Following such plating, an unused portion of the PTH barrel may be drilled with an oversized drill to reduce or remove the potentially resonant step, leaving a cylindrical void of air 412.

Conventionally, this back-drilling, or controlled depth drilling process, requires that each board be handled individually and subjected to an additional drilling procedure, whereas conventional PTH drilling can be performed in a single procedure on a stack of boards simultaneously. In addition, accurate depth control and registration is required for each back-drilled hole, while through-hole drilling does not need exacting depth control, and may allow overall less stringent drill registration. The additional handling and processing required for back-drilled vias add to the cost of the board and can also negatively affect yield.

As shown in FIG. 7, buried via 430 and blind via 450 may be used to create plated-through holes that span particular layer transitions with no stub and no drill hole beyond which what is necessary for the desired transition. Conventionally, blind and buried vias are created within individual layers or groups of PCB layers before final lamination into a complete board and subsequent final through-hole drilling and platings procedures. The process of creating buried via 430 and blind via 450 differ from conventional plated-through hole techniques by requiring separate drilling and plating steps for each set of transitions. This, like back-drilling, is a process-intensive method that will drive up circuit board costs and reduce yield. Furthermore, blind and buried vias are generally not compatible with through-hole leaded and press fit components.

Figure 8:
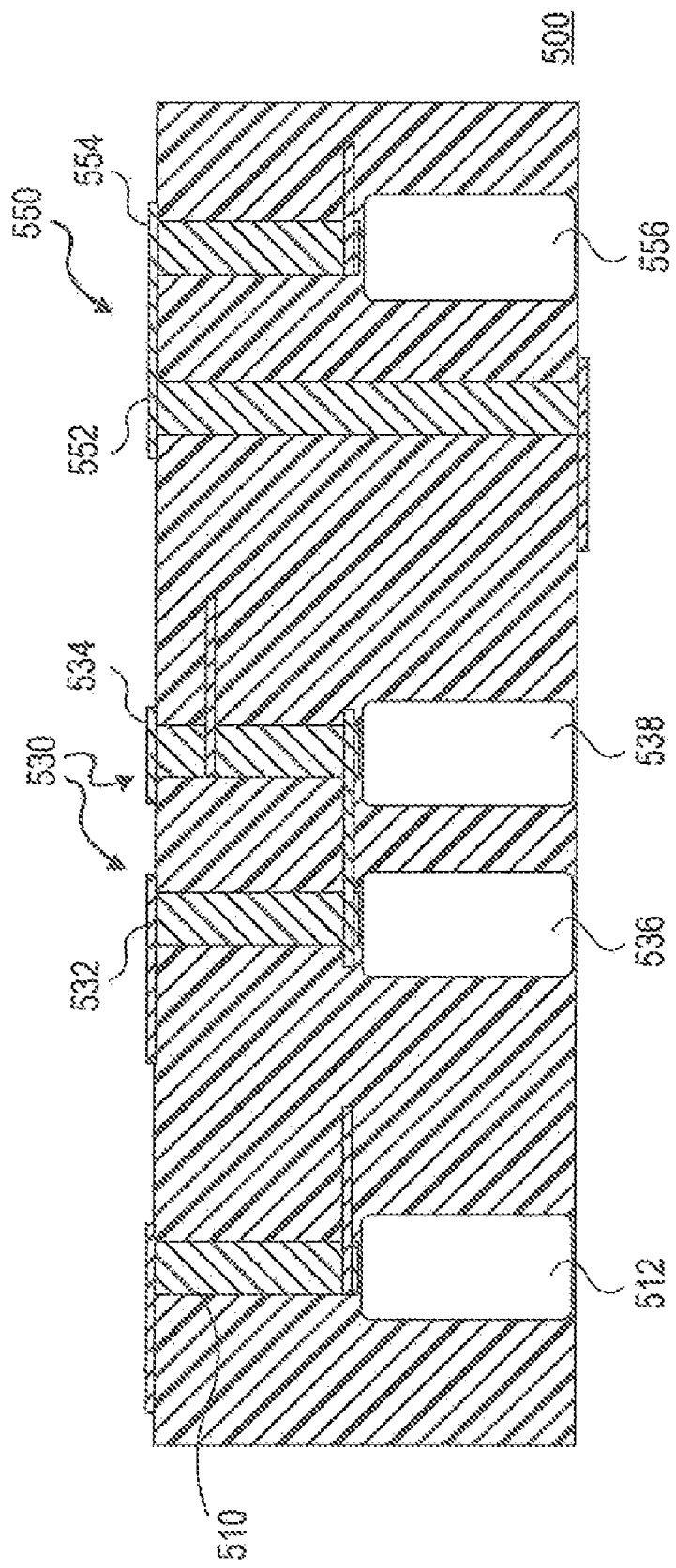
FIG. 8 is a diagram of a circuit board illustrating series coupled back-drilled vias, in accordance with one embodiment.

FIG. 8 illustrates a diagram of a circuit board 500 to illustrate pairs of coupled back-drilled vias, in accordance with one embodiment. Representatively, circuit board 500 includes conventional back-drilled via 510, as well as coupled back-drilled via 530 and coupled back-drilled via 550. As illustrated, coupled back-drilled via 530 includes first back-drilled via 532 and second back-drilled via 534 coupled in series within an inner circuit board layer. As illustrated, bores 536 and 538 remove any additional via stubs below the series connection of first via 532 and second via 534. As further illustrated, coupled back-drilled via 530 includes plated through-holes at via 552, which is coupled in series to back-drilled via 554, which includes bore 556. As illustrated, formation of back-drilled coupled signal vias 530 and 550 require access to one side of the circuit board and require a single hole depth while providing a performance improvement over a single back-drilled via.

Figure 9:
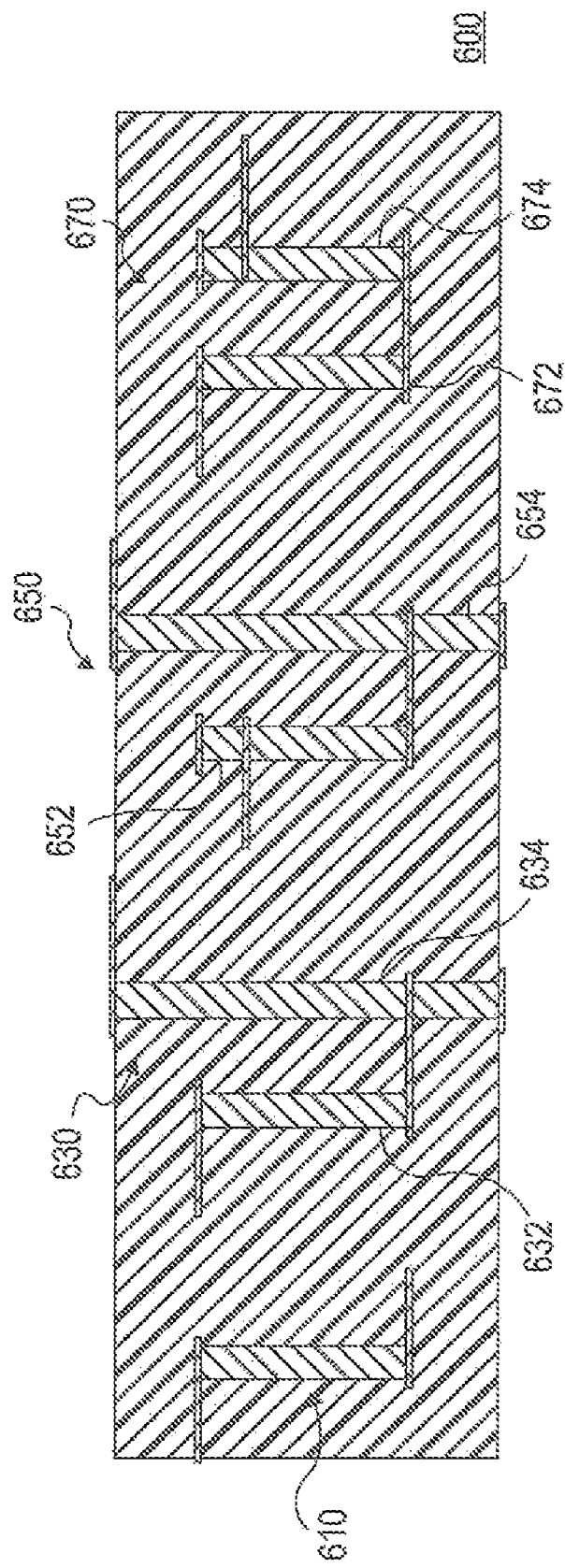
FIG. 9 is a circuit board illustrating series coupled buried vias, in accordance with one embodiment.

FIG. 9 is a diagram illustrating circuit board 600 to illustrate buried coupled signal vias, in accordance with one embodiment. Representatively, buried vias 610 cannot be improved by including a series connected via. However, buried coupled signal vias 630, 650 and 670 provide an improvement, as compared to the vias without the additional coupled signal via. Representatively, buried coupled signal vias 630 includes buried via 632 and plated-through hole via 634, which are coupled in series within a circuit board layer. Likewise, buried coupled signal vias 650 include buried via 652 and plated-through hole via 654 coupled in series within the circuit board layer, in accordance with one embodiment. Buried coupled signal vias 670 include first buried via 672 and second buried via 674 coupled in series within an inner circuit board layer in one embodiment.

Figure 10:
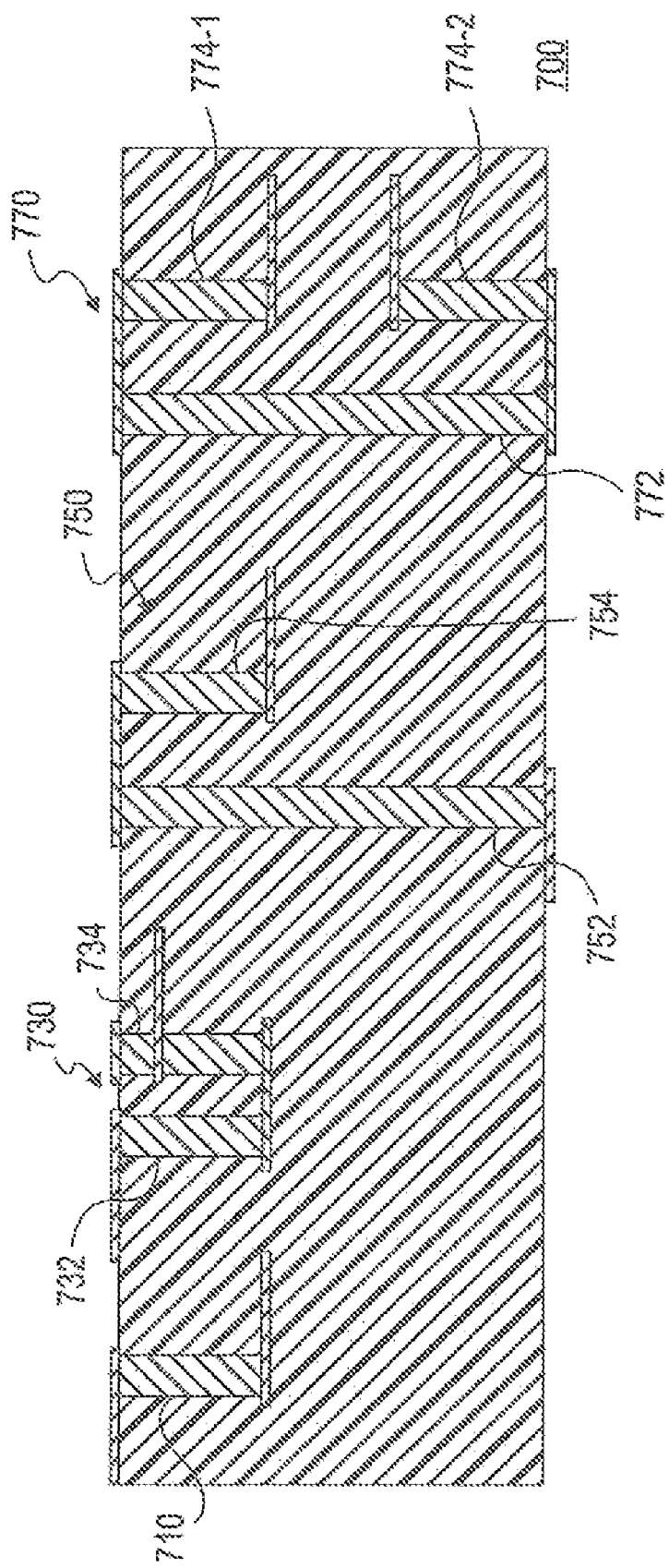
FIG. 10 is a diagram illustrating a circuit board including series coupled blind vias, in accordance with one embodiment.

FIG. 10 is a diagram illustrating circuit board 700 including pairs of blind coupled signal vias, in accordance with one embodiment. Representatively, blind via 710 cannot be improved with the addition of a series connected via. Representatively, blind coupled signal via 730 includes first blind via 732 and second blind via 734, coupled in series within an inner circuit board layer, in accordance with one embodiment. Blind coupled signal via 750 includes plated-through hole via 752 and blind via 754 coupled in series, in accordance with one embodiment. Blind coupled signal via 770 includes plated-through hole via 772 coupled in series to first blind via 774-1 and second blind via 774-2. Accordingly, as illustrated with reference to FIGS. 8-10, the use of a series connected coupled signal via may be used to reduce the step length for such techniques as back-drilled vias, blind vias and buried vias by further eliminating unused stubs to further reduce stub resonance.

Figure 11:
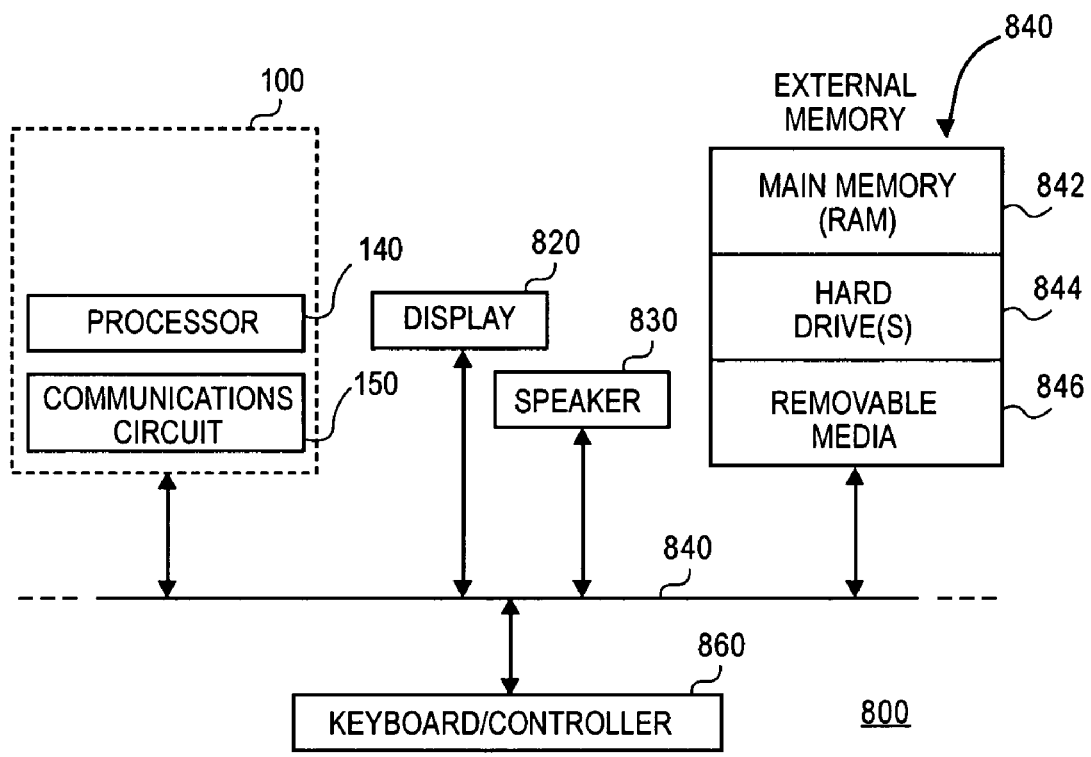
FIG. 11 is a block diagram illustrating an electronic system including a circuit board including a series coupled via, in accordance with one embodiment.

FIG. 11 is a block diagram of an electronic system 800 incorporating at least one electronic assembly, such as circuit board 100 illustrated in FIG. 2. Electronic system 800 may be a computer system that includes a system bus 810 to electrically couple the various components of electronic system 800 together. System bus 810 may be a single bus or any combination of busses. Circuit board 100 is electrically coupled to system bus 810 and may include any circuit, or combination of circuits. In one embodiment, circuit board 100 includes a processor 140, which can be of any type.

As used herein, processor means any type of circuit such as, but not limited to, a microprocessor, a microcontroller, a graphics processor or a digital signal processor. Other types of circuits that can be included in circuit board 100 are a custom circuit or an application-specific integrated circuit, such as communication circuit 150 for use in wireless devices such as cellular telephones, pagers, portable computers, two-way radios, and similar electronic systems. The electronic system 800 may also include an external memory 840 that in turn may include one or more memory elements suitable to the particular application, such as a main memory 842 in the form of random access memory (RAM), one or more hard drives 844, and/or one or more drives that handle removable media 846, such as diskettes, compact disks (CDs) and digital video disks (DVDs).

The electronic system 800 may also include a display device 820, a speaker 830, and a controller 860, such as a keyboard, mouse, trackball, game controller, microphone, voice-recognition device, or any other device that inputs information into the electronic system 800. As shown herein, circuit board 100 can be implemented in a number of different embodiments, including an electronic package, an electronic system and a computer system. The elements, materials, geometries and dimensions can all be varied to suit particular requirements.

Figure 12:
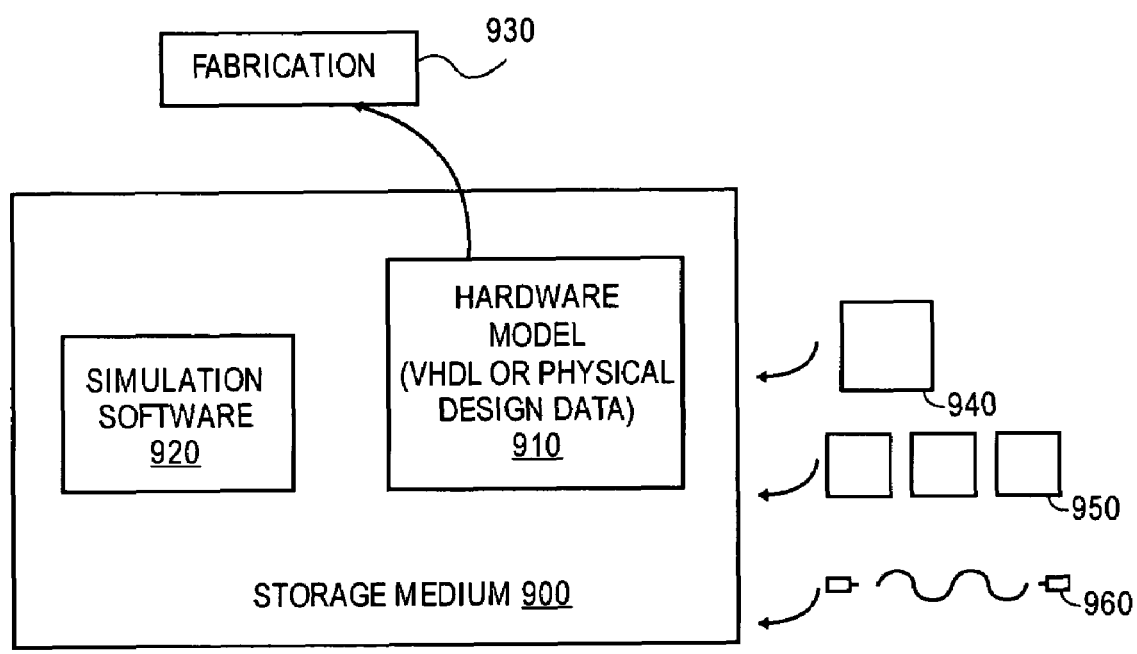
FIG. 12 is a block diagram illustrating various design representations or formats for emulation, simulation and fabrication of a design using the disclosed techniques.

FIG. 12 is a block diagram illustrating various representations or formats for simulation, emulation and fabrication 930 of a design using the disclosed techniques. Data representing a design may represent the design in a number of manners. First, as is useful in simulations, the hardware may be represented using a hardware description language, or another functional description language, which essentially provides a computerized model of how the designed hardware is expected to perform. The hardware model 910 may be stored in a storage medium 900, such as a computer memory, so that the model may be simulated using simulation software 920 that applies a particular test suite 930 to the hardware model to determine if it indeed functions as intended. In some embodiments, the simulation software is not recorded, captured or contained in the medium.

Additionally, a circuit level model with logic and/or transistor gates may be produced at some stages of the design process. The model may be similarly simulated some times by dedicated hardware simulators that form the model using programmable logic. This type of simulation taken a degree further may be an emulation technique. In any case, reconfigurable hardware is another embodiment that may involve a machine readable medium storing a model employing the disclosed techniques.

Furthermore, most designs at some stage reach a level of data representing the physical placements of various devices in the hardware model. In the case where conventional semiconductor fabrication techniques are used, the data representing the hardware model may be data specifying the presence or absence of various features on different mask layers or masks used to produce the integrated circuit. Again, this data representing the integrated circuit embodies the techniques disclosed in that the circuitry logic and the data can be simulated or fabricated to perform these techniques.

In any representation of the design, the data may be stored in any form of a machine readable medium. An optical or electrical wave 960 modulated or otherwise generated to transport such information, a memory 950 or a magnetic or optical storage 940, such as a disk, may be the machine readable medium. Any of these mediums may carry the design information. The term "carry" (e.g., a machine readable medium carrying information) thus covers information stored on a storage device or information encoded or modulated into or onto a carrier wave. The set of bits describing the design or a particular of the design are (when embodied in a machine readable medium, such as a carrier or storage medium) an article that may be sealed in and out of itself, or used by others for further design or fabrication.

Alternate Embodiments

It will be appreciated that, for other embodiments, a different system configuration may be used. For example, while the system 800 includes a single CPU 140, for other embodiments, a multiprocessor system (where one or more processors may be similar in configuration and operation to the CPU 140 described above) may benefit from the series connected coupled vias of various embodiments. Further different type of system or different type of computer system such as, for example, a server, a workstation, a desktop computer system, a gaming system, an embedded computer system, a blade server, etc., may be used for other embodiments.

Having disclosed embodiments and the best mode, modifications and variations may be made to the disclosed embodiments while remaining within the scope of the embodiments of the invention as defined by the following claims.

What is claimed is:

1. A circuit board, comprising:
at least one plurality of signal vias connected in series to provide a signal layer transition between one or more circuit board layers, wherein the at least one plurality of signal vias includes
a first via having a first anti-pad;
a second via having a second anti-pad, the second via positioned proximate the first via to enable electromagnetic coupling between the first and second vias, wherein the first anti-pad and the second anti-pad are of different sizes;
a micro-strip layer coupling the first via and the second via in series;
a third via; and
a fourth via, the fourth via positioned proximate the third via to enable electromagnetic coupling between the third and fourth vias, the third via and a fourth via connected in series.

2. The circuit board of claim 1, wherein a diameter of the first via is greater than a diameter of the second via.

3. The circuit board of claim 1, wherein a size of an anti-pad of the first via is less than a size of an anti-pad of the second via.

4. The circuit board of claim 1, further comprising:
a first connector pin coupled to the first via;
a first trace coupled to the second via;
a second connector pin coupled to the third via; and
a second trace coupled to the fourth via, the first trace and the second trace to provide a differential signal pair.

5. The circuit board of claim 1, further comprising:
a ground via formed between the second via and the fourth via.

6. The circuit board of claim 1, wherein the fourth via is positioned proximate the second via to enable electromagnetic coupling between the second via and the fourth via.

7. The circuit board of claim 1, wherein a shape of an anti-pad of the second via is different than a shape of an anti-pad of the first via.

8. The circuit board of claim 1, wherein an anti-pad of the second via intersects an anti-pad of the first via.

9. An electronic system comprising:
a bus;
a memory coupled to the bus;
a circuit board electrically connected to the bus, the circuit board including a first via and a second via, the second via positioned proximate the first via to enable electromagnetic coupling between the first and second vias, the first via and the second via connected in series to provide a signal layer transition between one or more circuit board layers, wherein the first via has a first anti-pad and the second via has a second anti-pad and the first anti-pad and the second anti-pad are of different sizes;
a third via; and
a fourth via, the fourth via positioned proximate the third via to enable electromagnetic coupling between the third and fourth vias, the third via and a fourth via connected in series.

10. The system of claim 9, wherein a diameter of the first via is greater than a diameter of the second via.

11. The system of claim 9, further comprising:
a first connector pin coupled to the first via;
a first trace coupled to the second via;
a second connector pin coupled to the third via; and
a second trace coupled to the fourth via, the first trace and the second trace to provide a differential signal pair.

12. The system of claim 9, wherein an anti-pad of the second via intersects an anti-pad of the first via.

13. The system of claim 9, wherein the first via comprises a blind via and the second via comprises a plated-through hole via.

14. The system of claim 9, wherein the first via comprises a buried via and the second via comprises a plated-through hole via.

15. The system of claim 9, wherein the first via comprises a back-drilled via and the second via comprises a plated-through hole via.

16. The system of claim 9, further comprising a ground via formed between the second via and the fourth via.

17. The system of claim 9, wherein the fourth via is positioned proximate the second via to enable electromagnetic coupling between the second via and the fourth via.

* * * * *